United States Patent
Imai et al.

(10) Patent No.: US 7,036,383 B2
(45) Date of Patent: May 2, 2006

(54) PRESSURE SENSOR HAVING SENSOR CHIP AND SIGNAL PROCESSING CIRCUIT MOUNTED ON A COMMON STEM

(75) Inventors: Masahito Imai, Chita (JP); Yoshifumi Murakami, Obu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/972,474

(22) Filed: Oct. 26, 2004

(65) Prior Publication Data

US 2005/0103111 A1   May 19, 2005

(30) Foreign Application Priority Data

Nov. 13, 2003   (JP)   ............................. 2003-383994

(51) Int. Cl.
*G01L 7/00*   (2006.01)

(52) U.S. Cl. ........................................................ 73/754

(58) Field of Classification Search ................ 73/700, 73/715, 754
See application file for complete search history.

(56) References Cited

U.S. PATENT DOCUMENTS

2005/0056097 A1 * 3/2005 Banholzer et al. ............ 73/700

FOREIGN PATENT DOCUMENTS

| EP | 1 118 849 A1 | 7/2001 |
|---|---|---|
| JP | A-H10-90096 | 4/1998 |
| JP | A-H11-328545 | 4/1998 |
| JP | 411207085 A * | 8/1999 |

* cited by examiner

*Primary Examiner*—Edward Lefkowitz
*Assistant Examiner*—Andre Allen
(74) *Attorney, Agent, or Firm*—Posz Law Goup, PLC (57) ABSTRACT

A pressure sensor for detecting a pressure such as a brake oil pressure in an automobile is composed of a cylindrical stem, a sensor chip and a circuit board for processing an electrical signal from the sensor chip. The cylindrical stem includes a thin diaphragm formed at an axial end and an opening formed at the other axial end. The sensor chip is mounted on the diaphragm, and the circuit board is mounted on a flat side surface formed on the outer periphery of the cylindrical stem so that the circuit board is positioned perpendicularly to the sensor chip, thereby reducing a size of the pressure sensor in the radial direction of the stem. The pressure to be detected is introduced into the cylindrical stem from its opening, and the pressure is detected by the sensor chip mounted on the diaphragm.

11 Claims, 12 Drawing Sheets

PRESSURE SENSOR HAVING SENSOR CHIP AND SIGNAL PROCESSING CIRCUIT MOUNTED ON A COMMON STEM

CROSS-REFERENCE TO RELATED APPLICATION

This application is based upon and claims benefit of priority of Japanese Patent Application No. 2003-383994 filed on Nov. 13, 2003, the content of which is incorporated herein by reference.

BACKGROUND OF THE INVENTION

1. Field of the Invention

The present invention relates to a sensor for detecting a physical amount, such as pressure or acceleration, and more particularly to a pressure sensor having a sensor chip and a circuit for processing sensor signals mounted on a cylindrical stem that includes a diaphragm.

2. Description of Related Art

An example of this kind of pressure sensor is disclosed in JP-A-2001-272297. The pressure sensor is composed of a cylindrical stem having a diaphragm at one axial end. A pressure to be measured is introduced into the cylindrical stem from an opening formed at the other axial end of the stem, and the diaphragm distorts according to an amount of pressure applied thereto. A sensor chip for outputting an electrical signal representing the distortion of the diaphragm is connected to the outer surface of the diaphragm. A circuit board for processing the electrical signal is disposed around the sensor chip on a plane parallel to the outer surface of the diaphragm on which the sensor chip is mounted.

Because the sensor chip and the circuit board are positioned in parallel to each other in the conventional pressure sensor, a size of the pressure sensor in the radial direction of the stem becomes large. This positioning also makes the sensor structure complex.

SUMMARY OF THE INVENTION

The present invention has been made in view of the above-mentioned problem, and an object of the present invention is to provide an improved sensor for detecting a physical amount such as a pressure, in which a circuit board for processing sensor signals is positioned perpendicularly to a sensor chip to make the sensor compact as a whole.

The pressure sensor according to the present invention is composed of a cylindrical stem, a sensor chip and a circuit board for processing output signals from the sensor chip. A thin diaphragm to be distorted by a pressure applied thereto is formed at an axial end of the cylindrical stem, and an opening from which a pressure to be detected is introduced is formed at the other axial end of the cylindrical stem. The sensor chip is mounted on the diaphragm and connected thereto with glass having a low melting point. The sensor chip may be a semiconductor sensor chip that includes a bridge circuit forming a strain gauge. The circuit board is mounted on a flat side surface formed on the outer periphery of the cylindrical stem, so that the circuit board is positioned perpendicularly to the sensor chip.

Three flat side surfaces are formed on the outer periphery of the cylindrical stem in addition to the flat side surface on which the circuit board is mounted. A wiring member having an output terminal pin for outputting the sensor signals, a power source terminal pin to be connected to a power source and a grounding terminal pin is disposed around the cylindrical stem, so that each terminal pin is positioned on each flat side surface. The sensor chip, the circuit board and the terminal pins are electrically connected to one another by wire-bonding.

The sensor chip and the circuit board are covered with insulating gel. The semiconductor sensor chip may be replaced with a strain gauge directly formed on the diaphragm by vapor deposition or the like. The sensor chip may be mounted on a depressed portion formed on an insulator which is connected to the side surface of the cylindrical stem with adhesive.

The axial end of the cylindrical stem having the opening is hermetically connected to a structure containing a pressure to be detected. The structure may be a pipe leading brake oil therethrough. The pressure to be detected is introduced into the cylindrical stem from the opening, and the diaphragm is distorted by the pressure applied thereto. The sensor chip outputs an electrical signal corresponding to the distortion of the diaphragm. The sensor output is processed by the circuit board. Thus, the pressure is detected by the pressure sensor. The present invention may be applied to other sensors than the pressure sensor, such as an acceleration sensor or an airflow sensor.

Since the sensor chip and the circuit board are positioned perpendicularly to each other on the cylindrical stem, the pressure sensor size in the radial direction of the cylindrical stem can be made small, and the pressure sensor as a whole can be made compact. Other objects and features of the present invention will become more readily apparent from a better understanding of the preferred embodiment described below with reference to the following drawings.

DETAILED DESCRIPTION OF THE PREFERRED EMBODIMENT

Figure 1:
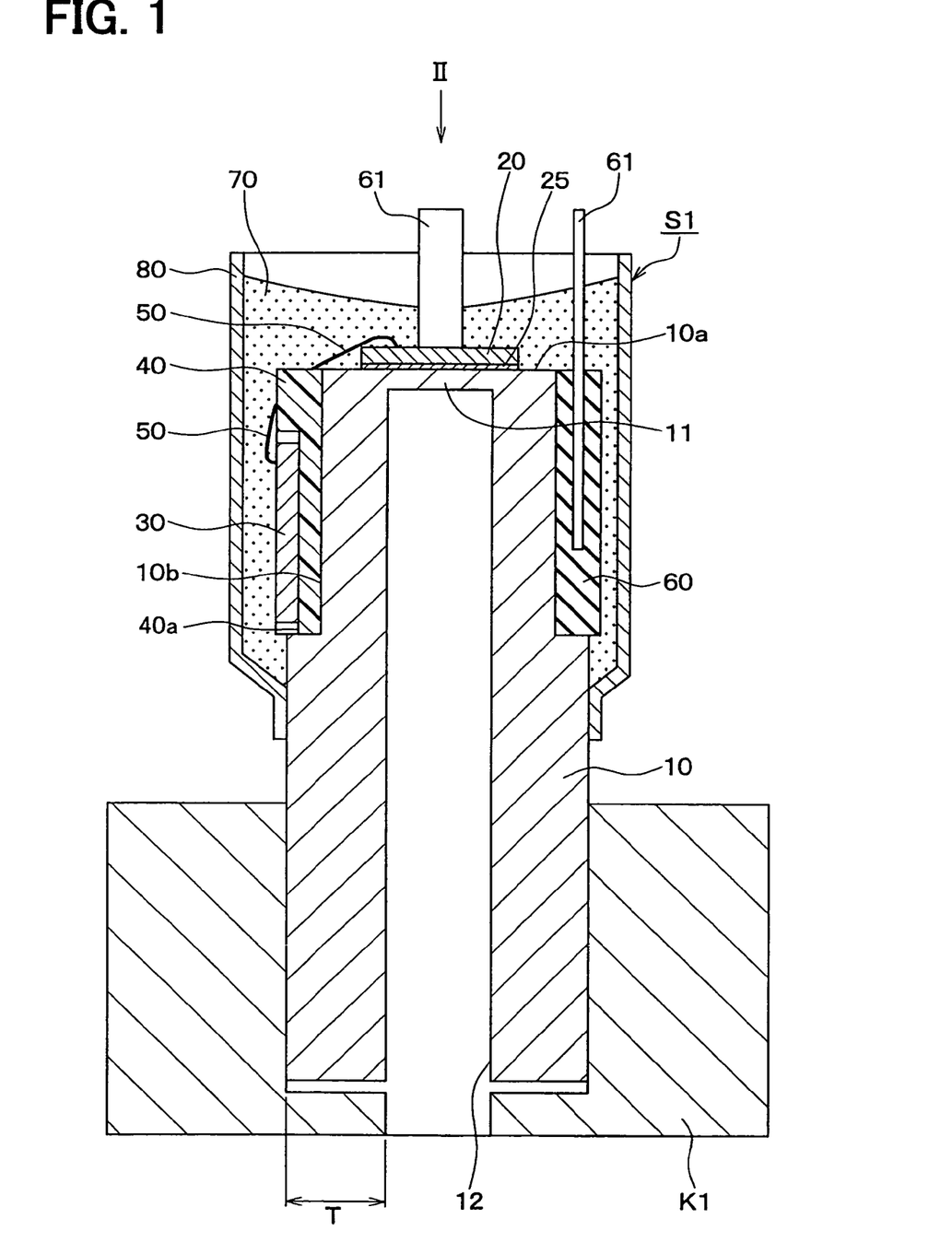
FIG. 1 is a cross-sectional view showing a pressure sensor according to the present invention, taken along line I—I shown in FIG. 2, the pressure sensor being connected to a structure containing a pressure to be detected.

A preferred embodiment of the present invention will be described with reference to FIGS. 1–5. The present invention is applicable to sensors for detecting a physical amount such as a pressure, an acceleration or a gas density. FIGS. 1–5 show a pressure sensor as a preferred embodiment of the present invention. This pressure sensor can be used in an automobile vehicle for detecting a pressure of brake oil, a fuel pressure in a fuel pipe or the like. In FIG. 1, a pressure sensor S1 is hermetically connected to a structure K1 containing a pressure to be detected.

The pressure sensor S1, as shown in FIGS. 1–5, is composed of: a cylindrical stem 10 having a diaphragm 11 at one axial end and an opening 12 at the other axial end; a sensing member such as a semiconductor sensor chip 20 mounted on an outer surface 10a of the diaphragm 11; a circuit board 30 for processing sensor signals; and other associated components. The diaphragm 11 is made thin so that it distorts when a pressure introduced from the opening 12 is applied thereto. As shown in FIGS. 5A and 5B, four flat side surfaces 10b are formed on the outer periphery of the cylindrical stem 10. As shown in FIG. 5A, the four flat surfaces 10b make a square when viewed from the top of the stem 10. A portion of the stem 10 connected to the structure K1 is round, and the stem 10 is connected to the structure K1 by welding, screws or the like and hermetically sealed. The structure K1 may be a brake oil pipe, a fuel pipe or the like, through which fluid flows.

Figure 5A:
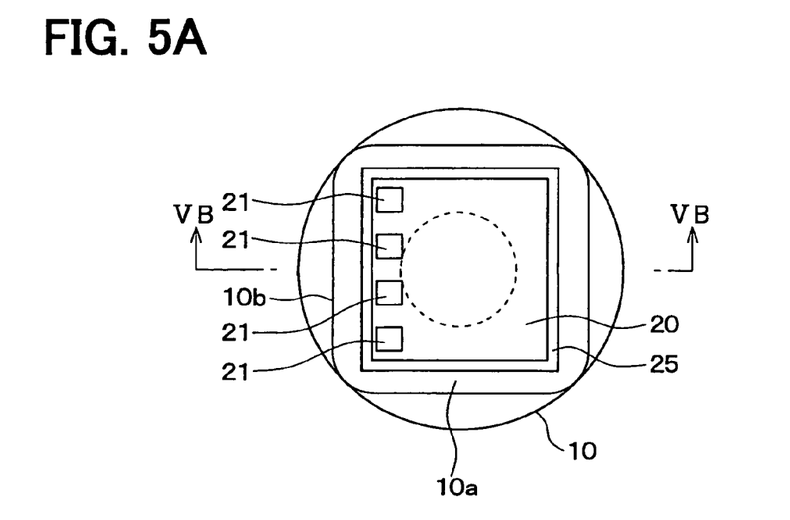
FIG. 5A is a plan view showing an outer surface of a diaphragm on which a sensor chip is mounted.
Figure 5B:
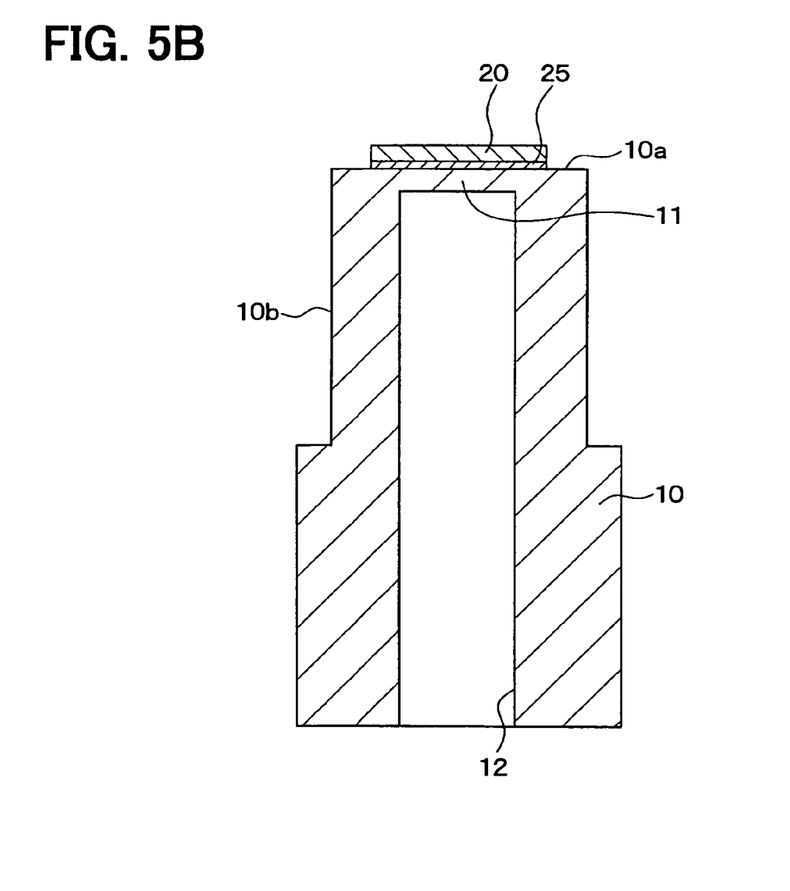
FIG. 5B is a cross-sectional view showing a cylindrical stem on which a sensor chip is mounted, taken along line VB—VB shown in FIG. 5A.

The sensor chip 20 is connected to the outer surface 10a of the diaphragm 11 by glass 25 having a low melting point. As shown in FIG. 5A, the sensor chip is square-shaped. The sensor chip is a semiconductor sensor chip made of monocrystalline silicon, for example. The sensor chip 20 may include a bridge circuit functioning as a strain gauge that outputs electrical signals according to an amount of distortion in the diaphragm 11. The stem 10 is made of a metallic material having a high strength because a high pressure is applied thereto. A thermal expansion coefficient of the material of the stem 10 has to be low because the semiconductor sensor chip 20 is connected thereto by the glass 25. More particularly, the stem 10 may be made of a material that includes Fe, Ni and Co, or Fe and Ni, as a main component, and Ti, Nb and Al, or Ti and Nb, as a precipitation hardening material. The stem 10 may be made by press-work, machining or cold forging.

The circuit board 30 for processing the electrical signals outputted from the sensor chip 20 is connected to the side surface 10b of the stem 10 via an insulator 40. The circuit board 30 may be an integrated circuit chip mounted on a ceramic substrate or a printed circuit board. The circuit board 30 amplifies the sensor signals or converts the sensor signals to easy-to-handle electrical signals. The circuit board 30 is connected to the stem 10 so that it becomes perpendicular to the outer surface 10a on which the sensor chip 20 is mounted, as shown in FIG. 1. The circuit board 30 is connected to a depressed portion 40a formed on the insulator 40 with adhesive, and then the insulator 40 is mounted on the side surface 10b with adhesive.

Figure 2:
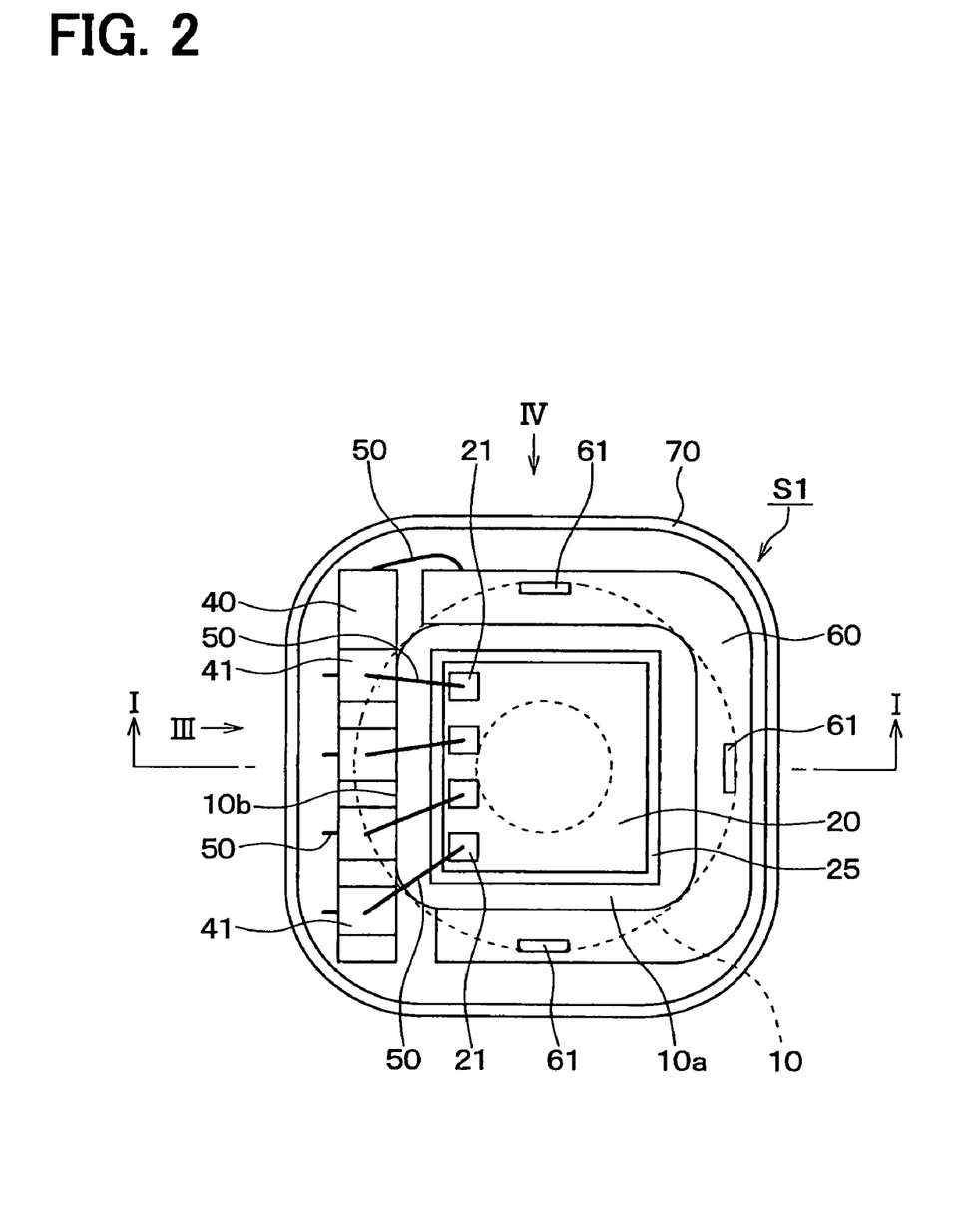
FIG. 2 is a plan view of the pressure sensor, viewed in direction II shown in FIG. 1.
Figure 3:
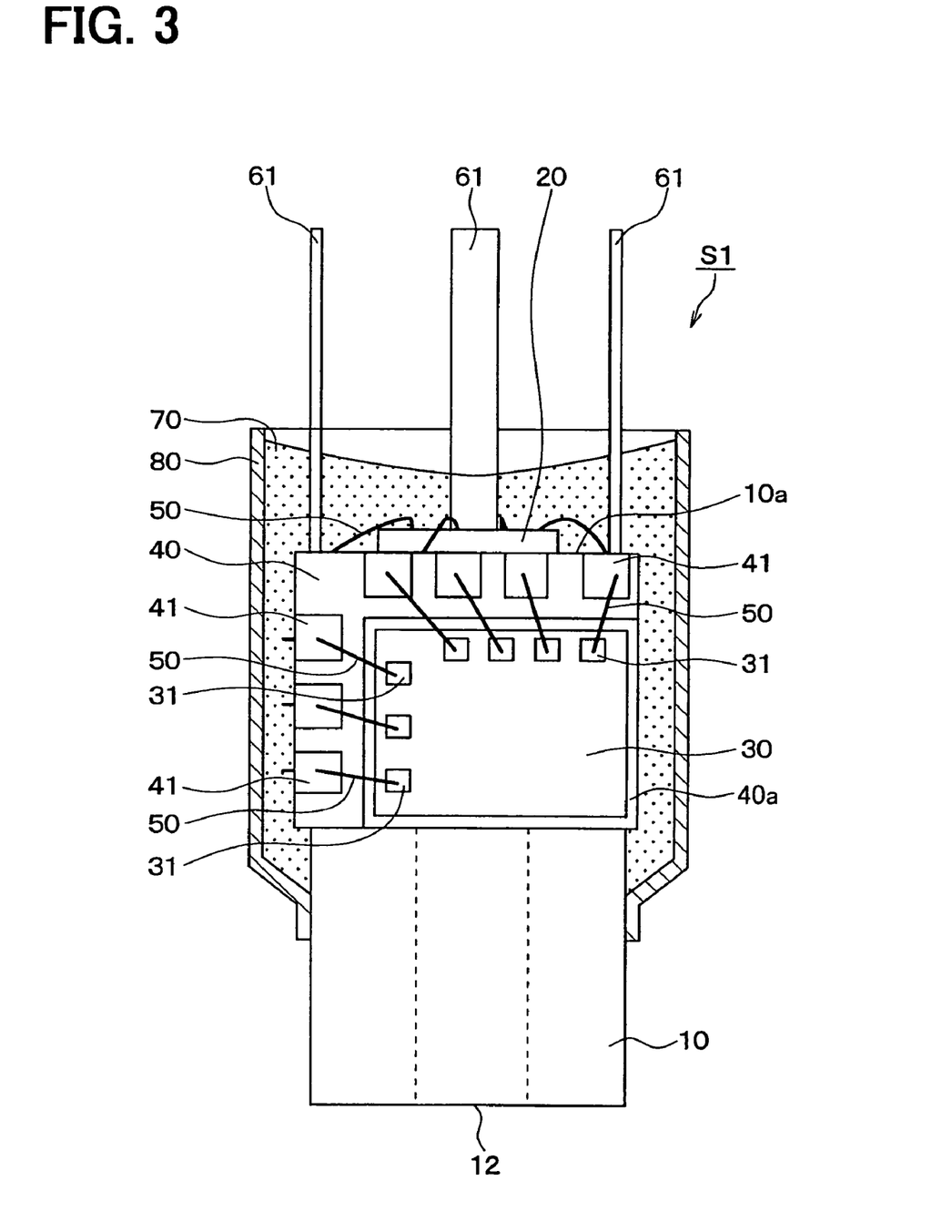
FIG. 3 is a side view showing the pressure sensor, partially cross-sectioned and viewed in direction III shown in FIG. 2.

As shown in FIG. 3, pads 31 formed on the circuit board 30 and pads 41 formed on the insulator 40 are electrically connected by bonding wires 50. As shown in FIG. 2, pads 21 formed on the sensor chip 20 and the pads 41 of the insulator 40 are electrically connected by bonding wires 50. Thus, the sensor chip 20 and the circuit board 30 are electrically connected via the insulator 40.

Figure 4:
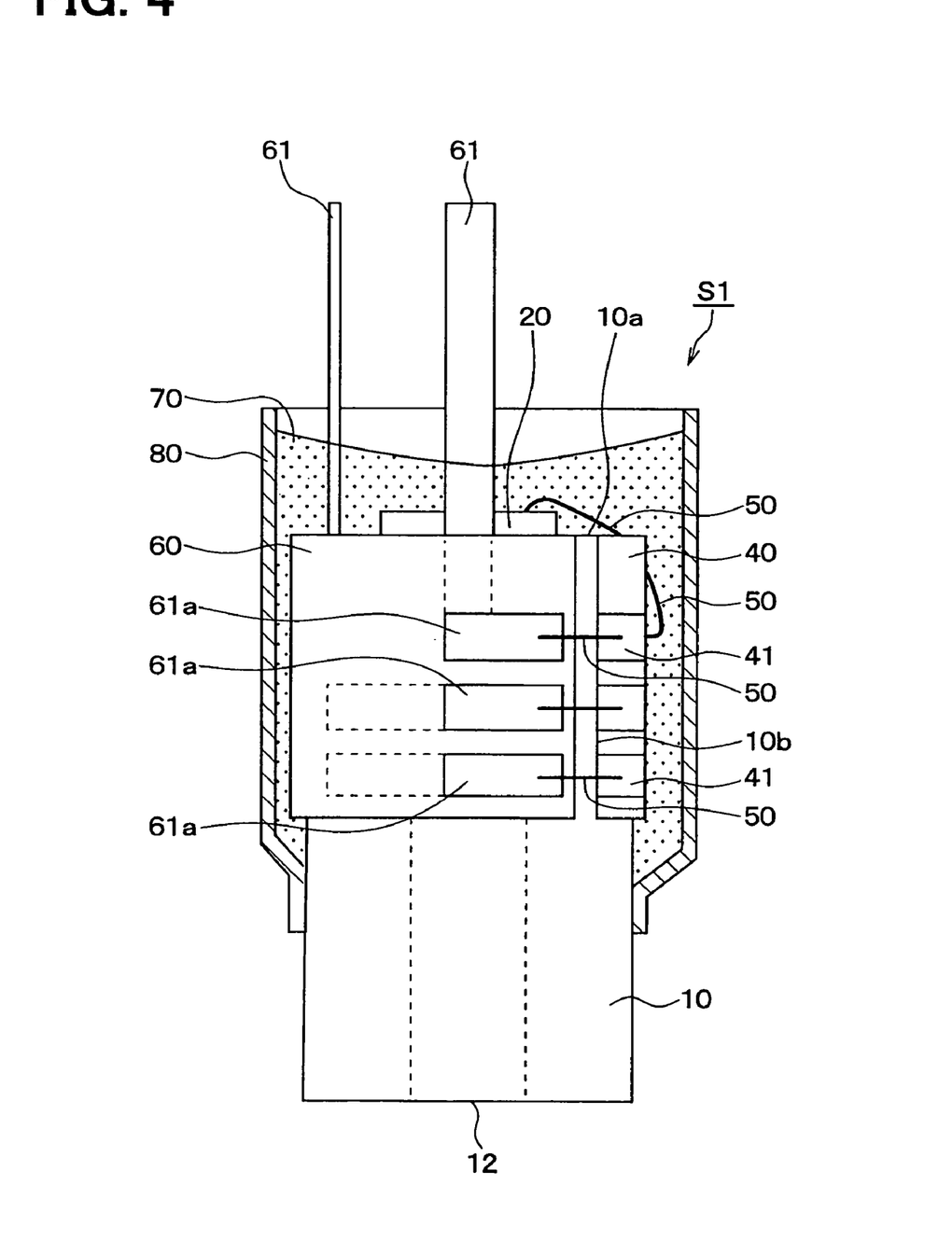
FIG. 4 is a side view showing the pressure sensor, partially cross-sectioned and viewed in direction IV shown in FIG. 2.

As better seen in FIG. 2, a wiring member 60 having three terminal pins 61 embedded therein is connected to the three side surfaces 10b of the stem 10 with adhesive. The first one of the three terminal pins 61 is an output terminal pin for leading the sensor outputs to an outside circuit, the second one is a ground terminal pin to be grounded, and the third one is a power source terminal pin to be connected to a power source. Each terminal pin 61 is positioned on a respective side surface 10b of the stem 10. As shown in FIG. 4, the terminal pins 61 in the wiring member 60 are electrically connected to the pads 41 of the insulator 40. More particularly, pads 61a connected to the terminal pin 61 are electrically connected to pads 41 of the insulator 40 through bonding wires 50. Thus, the sensor chip 20, the circuit board 30 and the wiring member 60 are electrically connected to one another via the pads 41 of the insulator 40. The sensor signals outputted from the sensor chip 20 are processed in the circuit board 30 and outputted from the output terminal pin 61 of the wiring member 60.

As shown in FIG. 1, an outer pipe 80 made of a metallic material is connected to the stem 10, so that a space containing insulating gel 70 such as silicone gel is formed between the stem 10 and the outer pipe 80 and on the sensor chip 20 as well. The sensor chip 20 and the circuit board 30 are covered with the insulating gel 70. The outer pipe 80 is connected to the stem 10 by forcibly inserting the stem 10 into the outer pipe 80 or by welding.

Figure 6:
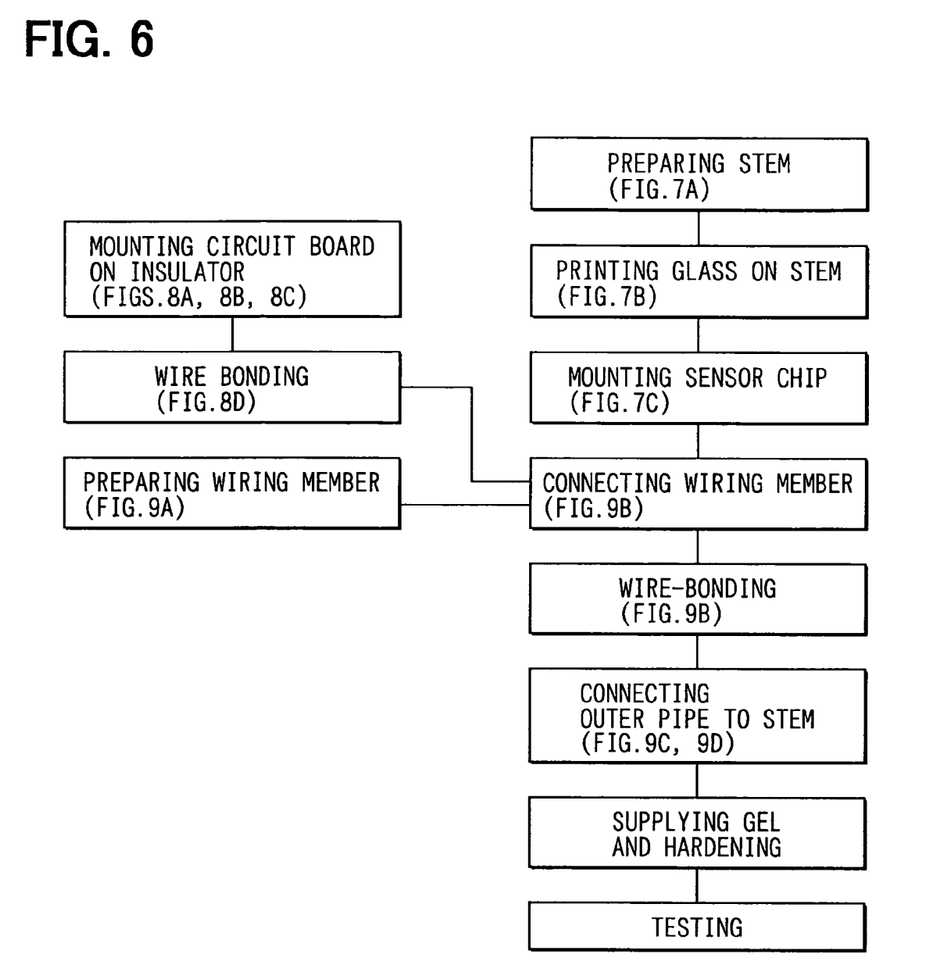
FIG. 6 is a chart showing a series of processes of manufacturing the pressure sensor.
Figure 7A:
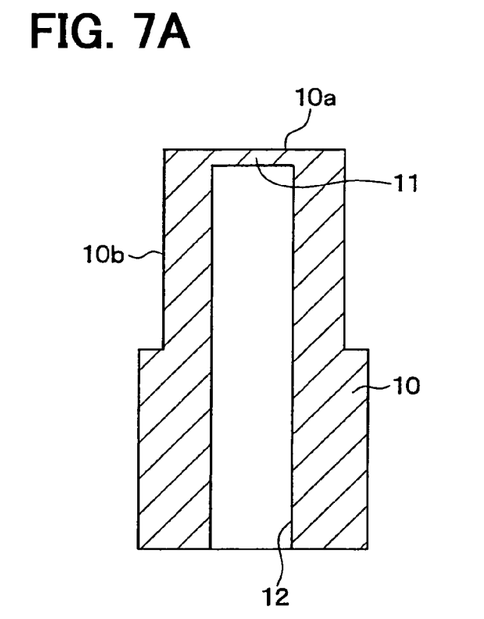
FIGS. 7A–7C show a process for mounting a sensor chip on a cylindrical stem.
Figure 7B:
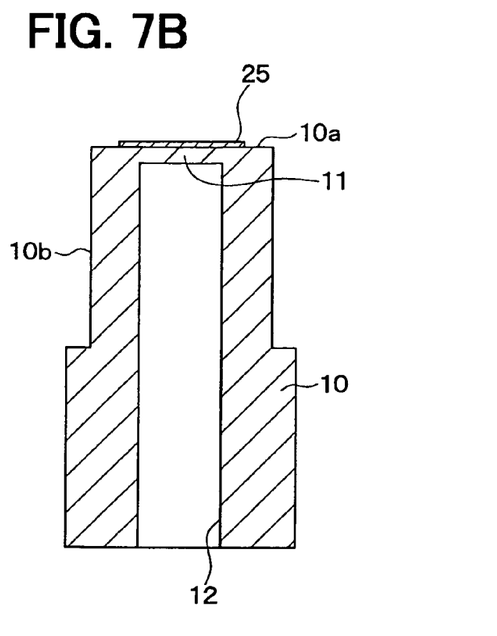
Figure 7C:
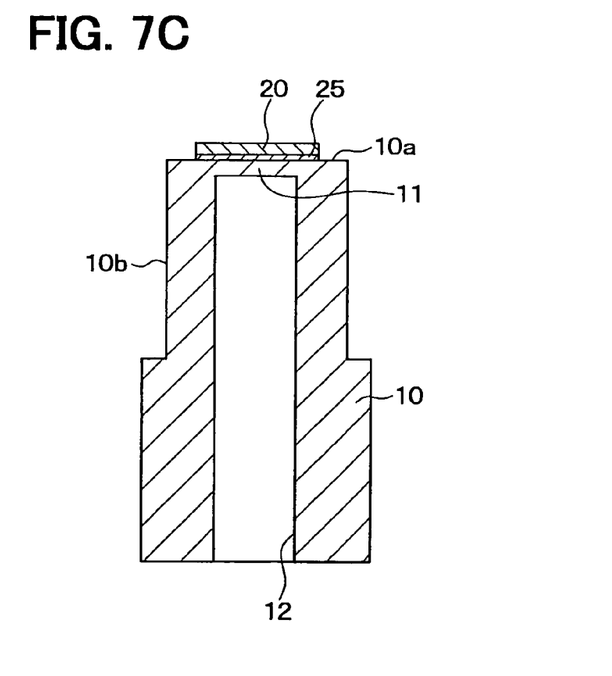

A process of manufacturing the pressure sensor S1 will be described with reference to FIGS. 6–9D. In FIG. 6, a flow of manufacturing process is shown, referring to respective drawings showing details. First, the cylindrical stem 10 is prepared as shown in FIG. 7A. Then, glass 25 having a low melting point is printed on the outer surface 10a of the diaphragm 11 as shown in FIG. 7B. Then, the sensor chip 20 is mounted on the outer surface 10a and is bonded thereto by melting and solidifying the glass 25.

Figure 8A:
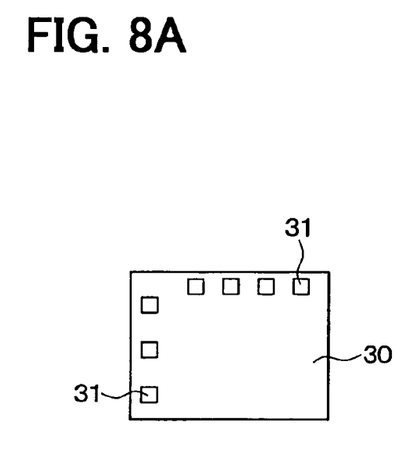
FIGS. 8A–8D show a process for mounting a circuit board on a depressed portion of an insulator.
Figure 8B:
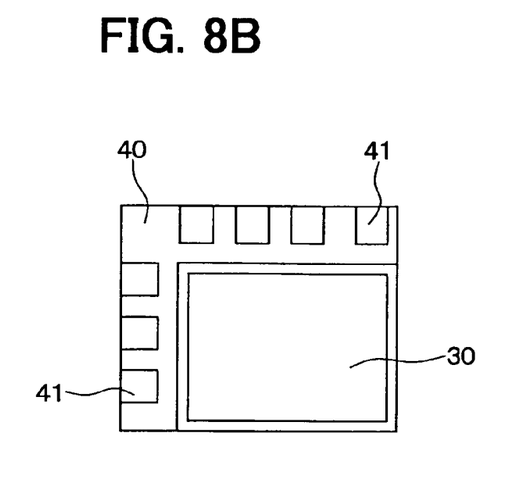
Figure 8C:
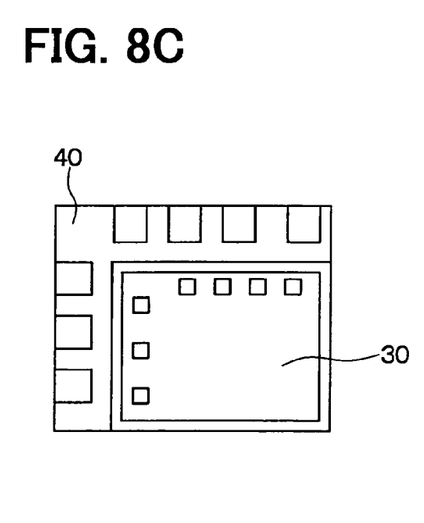
Figure 8D:
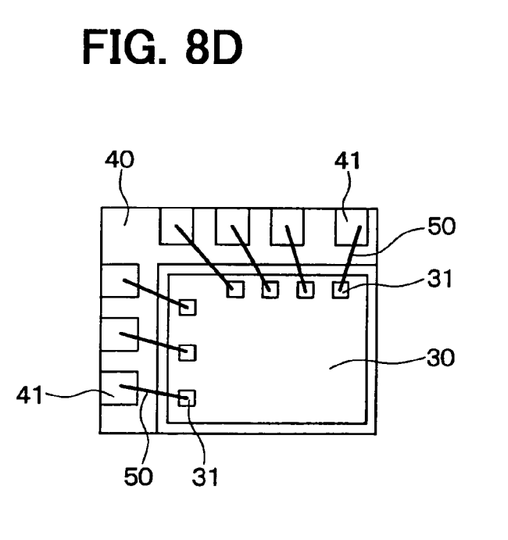
Figure 9A:
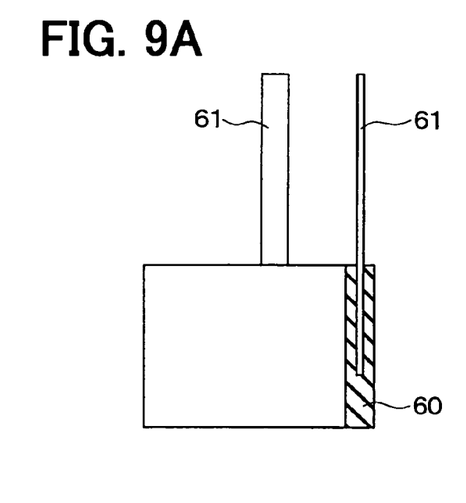
FIGS. 9A–9D show a process for mounting a wiring member on a cylindrical stem and connecting an outer pipe to an outer periphery of the stem.
Figure 9B:
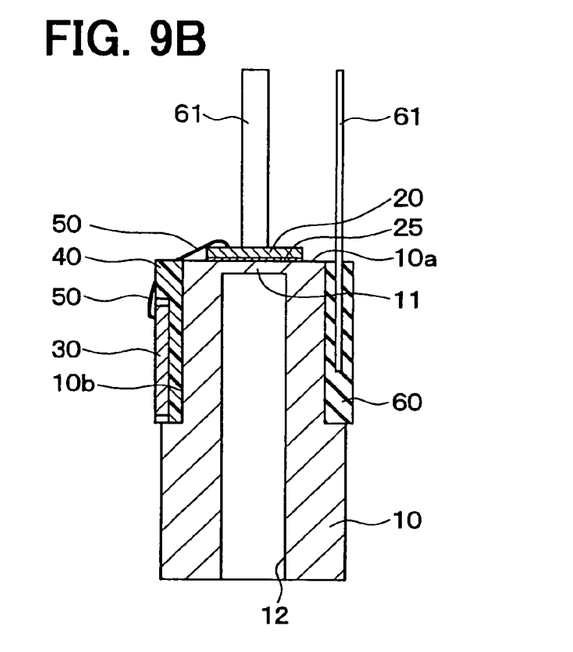

On the other hand, a circuit board 30 having pads 31 is prepared as shown in FIG. 8A. The circuit board 30 is mounted on the depressed portion 40a of the insulator 40, as shown in FIG. 8B, and both are bonded with adhesive as shown in FIG. 8C. Then, the pads 31 of the circuit board 30 are electrically connected to the pads 41 of the insulator 40 through bonding wires 50 formed by a wire-bonding process, as shown in FIG. 8D. As shown in FIG. 9A, a wiring member 60 in which three terminal pins 61 are embedded is formed by molding a resin material. Then, as shown in FIG. 9B, the insulator 40 on which the circuit board 30 are mounted and the wiring member 60 are connected to the side surfaces of the stem 10 with adhesive. Then, electrical connections between the sensor chip 20 and the insulator 40, and electrical connections between the wiring member 60 and the insulator 40 are made by forming bonding wires 50 by a wire-bonding process.

Figure 9C:
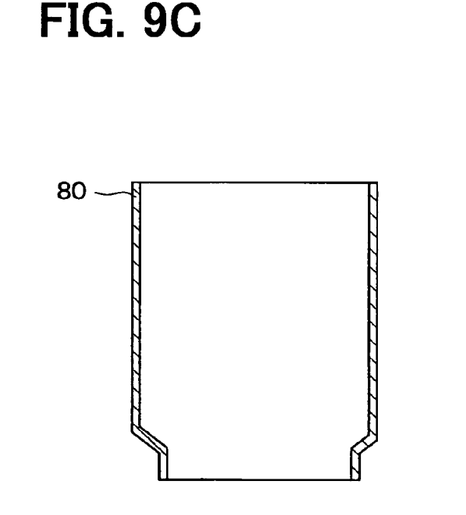
Figure 9D:
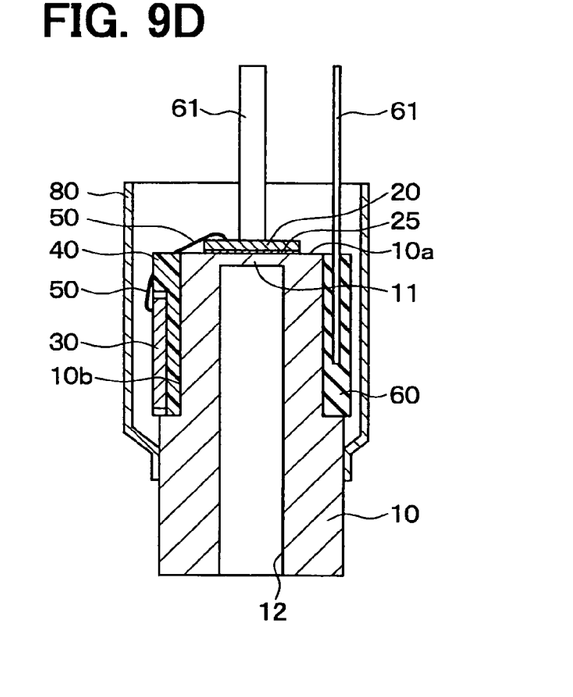

The outer pipe 80 shown in FIG. 9C is formed from a metallic material, and the outer pipe 80 is connected to the outer periphery of the stem 10 by forcibly inserting the stem 10 into the outer pipe 80 or by welding, as shown in FIG. 9D. Then, insulating gel 70 is supplied to cover the sensor chip 20 and the circuit board 30. It is preferable to supply the insulating gel 70 under vacuum to avoid formation of air voids in the insulating gel 70. Then, the insulating gel 70 is hardened. Finally, the pressure sensor S1 is tested to ascertain its operation and performance.

The pressure sensor S1 is hermetically connected to the structure K1 in which the pressure to be detected is contained. The pressure to be detected is introduced into the stem 10 through the opening 12 and is applied to the diaphragm 11. The diaphragm 11 distorts in response to an amount of pressure applied thereto. The sensor chip 20 outputs electrical signals corresponding to the distortion of the diaphragm 11. The sensor signals are processed by the circuit board 30 and outputted from the output terminal pin 61. Based on the pressure thus detected, a braking system or a fuel injection system of an automobile vehicle is controlled, for example.

Advantages of the above-described embodiment will be summarized. Since the circuit board 30 is connected to the side surface 10b of the stem 10 and the sensor chip 20 is mounted on the outer surface 10a of the stem 10, the circuit board 30 is positioned perpendicularly to the sensor chip 20. Therefore, the size of the pressure sensor S1 in the radial direction of the stem 10 can be made small, compared with the conventional pressure sensor in which the circuit board and the sensor chip are mounted on the same plane. It is particularly important to make the radial size of the pressure sensor S1 small, in case plural pressure sensors S1 are installed in parallel, e.g., in a brake system of an automobile. In addition, an area for mounting the pressure sensor S1 on the structure K1 can be made small by making the pressure sensor small. Particularly, a thickness T (shown in FIG. 1) in the mounting portion of the structure K1 can be made small, and thereby a force applied to the stem 10 in the dismounting direction becomes small.

Three terminal pins 61 are positioned on the respectively different side surfaces of the stem 10. Therefore, insulation between terminal pins is well secured. Since the sensor chip 20 and the circuit board 30 are covered with the insulating gel 70, the electrical connections therein are well protected and good insulation is secured. The insulator 40 is disposed between the circuit board 30 and the stem 10. Therefore, parasitic capacitance between the circuit board 30 and the stem 10 is decreased, thereby preventing electrical noises from entering into the circuit board 30 from the stem 10.

Figure 10:
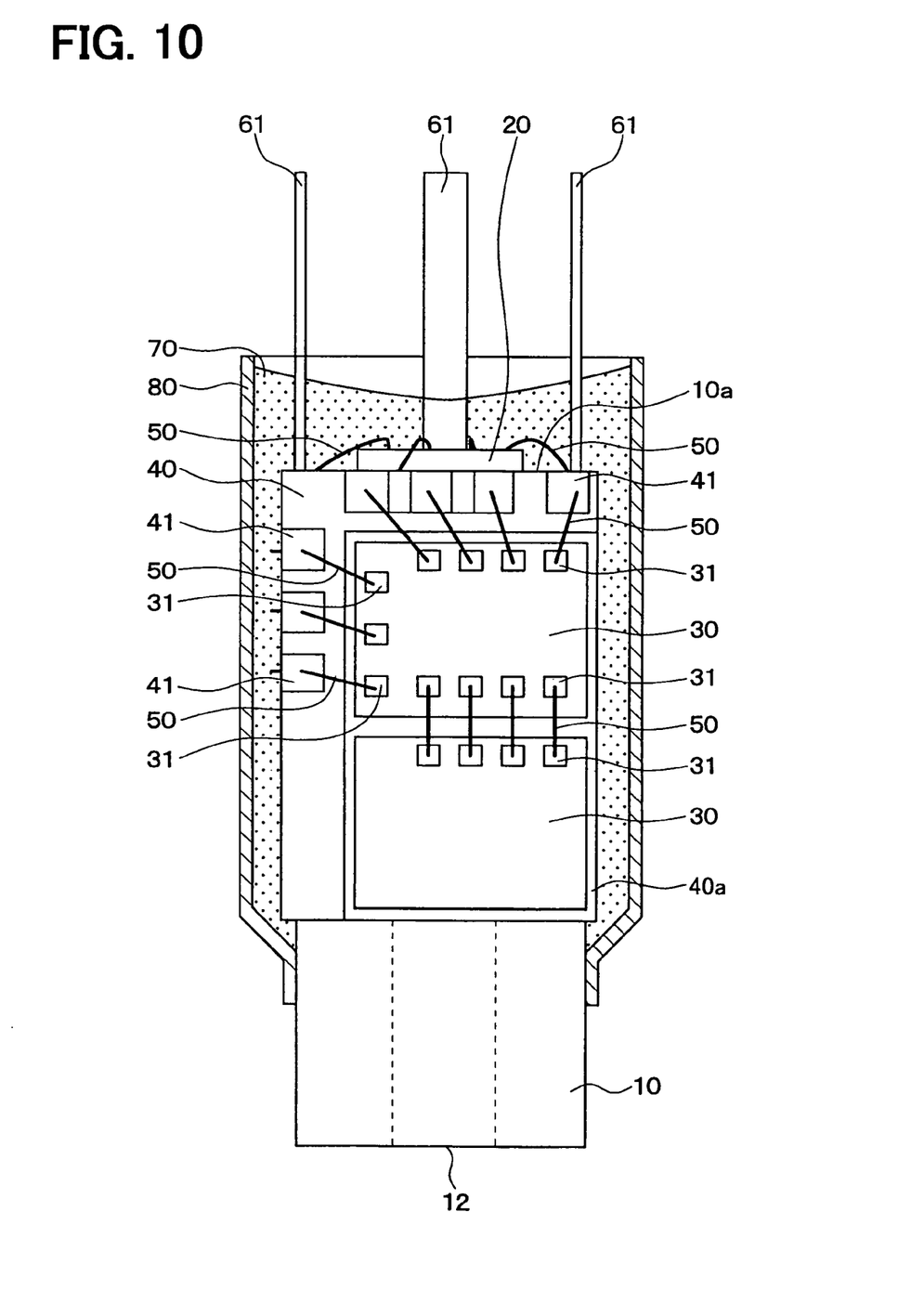
FIG. 10 is a cross-sectional view showing a modified form of a pressure sensor having a pair of circuit boards for processing sensor signals.

The present invention is not limited to the embodiment described above, but it may be variously modified. Some examples of modified forms are shown in FIGS. 10, 11 and 12A, 12B. In FIG. 10 (viewed in the same direction as in FIG. 3), a pressure sensor having a pair of circuit boards 30 is shown. If two or more circuit boards 30 are necessary to process the sensor signals, they can be mounted on the depressed portion 40a of the insulator 40.

Figure 11:
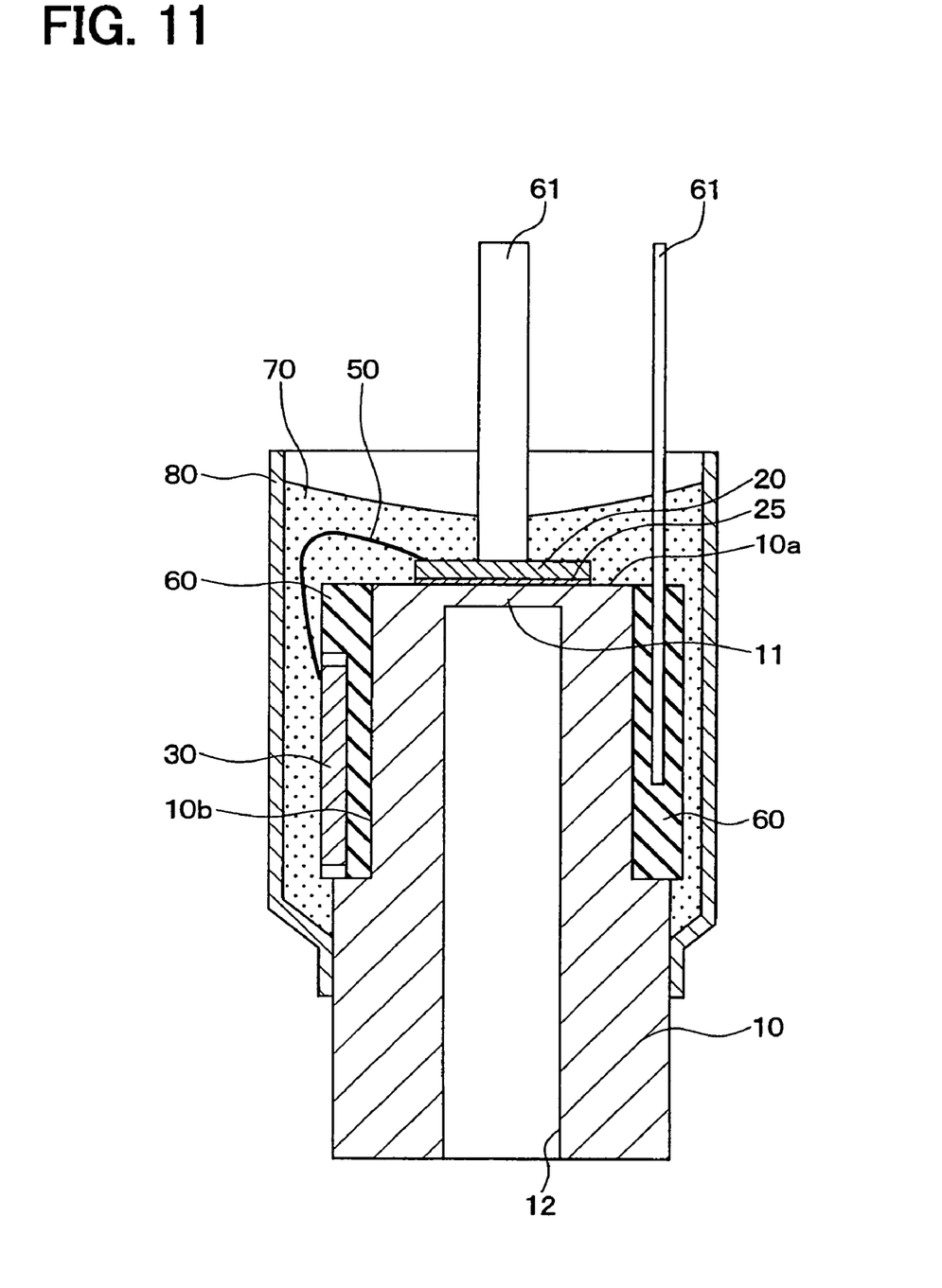
FIG. 11 is a cross-sectional view showing another modified form of a pressure sensor in which a sensor chip and a circuit board are directly connected through bonding wires.

In the modified form shown in FIG. 11 (viewed in the same direction as in FIG. 1), the sensor chip 20 and circuit board 30 are directly connected by the bonding wires 50, and the insulator 40 is eliminated. The wiring member 60 is modified to a form having a depressed portion 40a for mounting the circuit board 30 thereon.

Figure 12A:
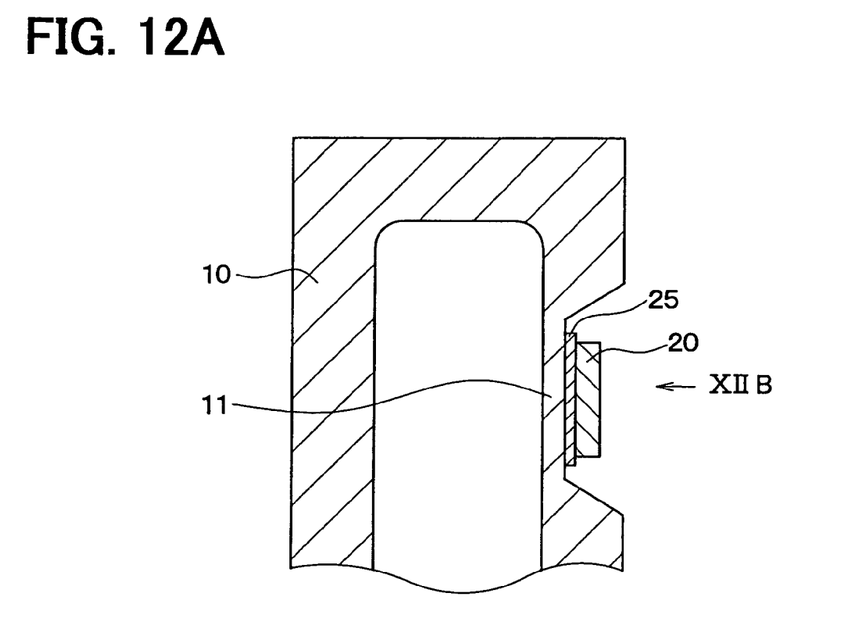
FIGS. 12A and 12B show a modified form of a pressure sensor in which a diaphragm is formed on a sidewall of a cylindrical stem.
Figure 12B:
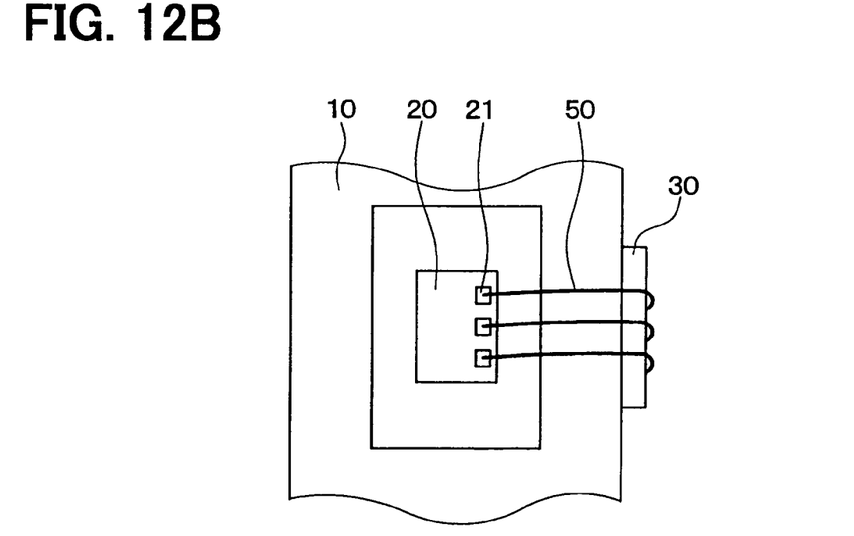

In the modified form shown in FIGS. 12A and 12B, the diaphragm 11 is formed on the sidewall of the cylindrical stem 10. A portion of the sidewall is made thin to form the diaphragm 11, and the sensor chip 20 is mounted on the diaphragm 11 with glass 25 having a low melting point. The circuit board 30 is also mounted on the sidewall at a surface perpendicular to the sensor chip 20, as shown in FIG. 12B. The sensor chip 20 is electrically connected to the circuit board 30 through bonding wires 50. Since the sensor chip 20 and the circuit board 30 are mounted on the stem 10 to make a right angle therebetween, the size of the pressure sensor in the radial direction of the stem 10 can be made small.

The circuit board 30 is mounted on the stem 10 in the foregoing embodiment and in the modified forms. However, the circuit board 30 may be mounted on a separate substrate which is integrated in the pressure sensor S1, as long as the separate substrate is perpendicularly positioned to the outer surface 10a on which the sensor chip 20 is mounted. Though the semiconductor sensor chip 20 is used as the sensing member in the foregoing embodiment, other devices such as a strain gauge directly formed on the diaphragm 11 by vapor deposition may be used as the sensing member.

The present invention may be applied to other devices for detecting a physical amount, such as an acceleration sensor, a gas sensor, an infrared sensor, a humidity sensor, a fluid-flow sensor and so on. In those detecting devices, the sensing member and the circuit board for processing sensing signals are positioned perpendicularly to each other.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A pressure sensor for detecting a pressure, the pressure sensor comprising:
   a cylindrical stem having a diaphragm and an opening for introducing a pressure to be detected into the stem;
   a sensing member mounted on an outer surface of the diaphragm, the sensing member outputting an electrical signal according to distortion of the diaphragm caused by the pressure to be detected; and a circuit board for processing the electrical signal outputted from the sensing member, wherein:

the circuit board is connected to the stem so that the circuit board is positioned perpendicularly to the outer surface of the diaphragm on which the sensing member is mounted.

2. The pressure sensor as in claim 1, wherein:

the diaphragm is formed at one axial end of the cylindrical stem, and the opening is positioned at the other axial end of the cylindrical stem.

3. The pressure sensor as in claim 1, wherein:

the sensing member is a semiconductor sensor chip.

4. The pressure sensor as in claim 1, wherein:

the circuit board is mounted on a side surface of the cylindrical stem.

5. The pressure sensor as in claim 4, wherein:

the side surface on which the circuit board is mounted is a flat surface.

6. The pressure sensor as in claim 1, wherein:

the sensor chip and the circuit board are electrically connected to each other by bonding wires.

7. The pressure sensor as in claim 1, wherein:

four flat side surfaces are formed on the cylindrical stem;

the circuit board is positioned on one of the four flat side surfaces; and a wiring member, having an output terminal pin for outputting sensor signals, a power source terminal pin for supplying power to the pressure sensor and a ground terminal pin for grounding, is disposed around the cylindrical stem, so that each terminal pin is positioned on each flat side surface other than the flat side surface on which the circuit board is positioned.

8. The pressure sensor as in claim 2, wherein:

the axial end of the cylindrical stem where the opening is positioned is hermetically connected to a structure containing the pressure to be detected.

9. The pressure sensor as in claim 1, wherein:

the sensor chip and the circuit board are covered with insulating gel.

10. The pressure sensor as in claim 4, wherein:

the circuit board is mounted on the side surface of the cylindrical stem via an insulator.

11. The pressure sensor as in claim 10, wherein:

the insulator includes a depressed portion on which the circuit board is mounted.

* * * * *